United States Patent [19]
Yang et al.

[11] Patent Number: 5,956,594
[45] Date of Patent: Sep. 21, 1999

[54] METHOD FOR SIMULTANEOUSLY FORMING CAPACITOR PLATE AND METAL CONTACT STRUCTURES FOR A HIGH DENSITY DRAM DEVICE

[75] Inventors: Fu-Liang Yang, Tainan; Bi-Ling Chen, Taipei; Erik S. Jeng, Hsinchu, all of Taiwan

[73] Assignee: Vanguard International Semiconductor Corporation, Hsin-Chu, Taiwan

[21] Appl. No.: 09/184,345

[22] Filed: Nov. 2, 1998

[51] Int. Cl.[6] .................................................. H01L 21/20
[52] U.S. Cl. ..................... 438/396; 438/256; 438/399; 438/210
[58] Field of Search .................................. 438/210, 253, 438/254, 255, 256, 396, 397, 398, 399, 648, 643

[56] References Cited

U.S. PATENT DOCUMENTS

| | | |
|---|---|---|
| 5,065,220 | 11/1991 | Paterson et al. . |
| 5,143,861 | 9/1992 | Turner . |
| 5,352,623 | 10/1994 | Kamiyama ............................. 438/396 |
| 5,597,754 | 1/1997 | Lou et al. . |
| 5,726,083 | 3/1998 | Takaishi ................................. 438/210 |
| 5,744,853 | 4/1998 | Quek et al. ............................ 438/210 |
| 5,792,681 | 8/1998 | Chang et al. .......................... 438/210 |
| 5,804,479 | 9/1998 | Aoki et al. ............................. 438/253 |
| 5,879,981 | 3/1999 | Tanigawa ............................... 438/396 |
| 5,895,239 | 4/1999 | Jeng et al. ............................. 438/254 |

*Primary Examiner*—Tuan H. NGuyen
*Attorney, Agent, or Firm*—George O. Saile; Stephen B. Ackerman

[57] ABSTRACT

A method for creating a DRAM device, featuring the simultaneous formation of a capacitor plate, used for a stacked capacitor structure, and the formation of a metal contact structure, and of a word line contact structure, has been developed. The process features the deposition of a barrier layer, and an overlying tungsten layer, on a storage node electrode, and with the deposition also completely filling a metal contact hole, and a word line hole. A patterning procedure, using an anisotropic RIE procedure, removes unwanted regions of tungsten and barrier layer, resulting in a capacitor plate, a metal contact structure, and a word line structure, all comprised of tungsten and the barrier layers, and all formed via one deposition procedure, and patterned using one RIE procedure.

26 Claims, 11 Drawing Sheets

METHOD FOR SIMULTANEOUSLY FORMING CAPACITOR PLATE AND METAL CONTACT STRUCTURES FOR A HIGH DENSITY DRAM DEVICE

BACKGROUND OF THE INVENTION (1) Field of the Invention

The present invention relates to methods used to fabricate semiconductor devices, and more specifically to a method for using the same process steps to form both a capacitor plate structure, and a metal contact structure, for a dynamic random access memory, (DRAM), device.

(2) Description of Prior Art

The semiconductor industry is continually striving to improve semiconductor device performance, while still attempting to reduce the cost of these same semiconductor devices. Micro-miniaturization, or the ability to create semiconductor devices with sub-micron features, have allowed the performance and cost objectives to be realized. Semiconductor devices, such as DRAM devices, fabricated with sub-micron features, experience performance enhancements, as a result of reduced performance degrading capacitances and resistances, in turn realized from the use of smaller features. In addition the use of sub-micron features result in the attainment of smaller chips, thus allowing more chips to be obtained from a specific size starting substrate, thus reducing the processing cost for a specific DRAM chip.

In addition to the cost reductions, realized via micro-miniaturization, further decreases in DRAM costs can be realized by process simplification. For example the ability to use only one process sequence, to form structures that were previously processed independently, requiring additional process sequences, result in costly reductions for DRAM devices. This invention will describe a process, (SMP), for Simultaneously forming a capacitor Plate and a Metal contact, using the same process sequence. Prior art, such as Lou, et al, in U.S. Pat. No. 5,597,754, describe a DRAM device with a stacked capacitor, (STC), structure, with a polysilicon capacitor plate, and a metal contact structure, however that prior art does not combine the formation of the capacitor plate and the metal contact structure, in a single process sequence, as this invention will describe.

SUMMARY OF THE INVENTION

It is an object of this invention to create a DRAM device, comprised of a stacked capacitor, (STC), structure, and metal contact structures.

It is another object of this invention to use a single process sequence to simultaneously form both the capacitor plate, of the STC structure, and a metal contact structure.

It is still another object of this invention to simultaneously form a capacitor plate, comprised of a tungsten layer, overlying a titanium nitride barrier layer, while forming a tungsten - titanium nitride, metal contact structure, with the metal contact structure overlying a region of the semiconductor substrate, exposed in a via hole.

In accordance with the present invention a process is described, for fabricating a high density DRAM device, in which the capacitor plate, of an STC structure, and a metal contact structure, are formed simultaneously, using the same materials, and using the same process sequence. Polycide gate structures, comprised of tungsten silicide on polysilicon, encapsulated by an overlying silicon nitride layer, and silicon nitride sidewall spacers, are formed on a thin gate insulator layer. After formation of source and drain regions, in the semiconductor substrate, between polycide gate structures, polysilicon contact plugs are formed in contact holes, in a first insulator layer, with the polysilicon contact plugs, contacting the top surface of source and drain regions. Polycide bit line structures, comprised of tungsten silicide on polysilicon, are formed in via holes, in a second insulator layer, contacting the underlying polysilicon pads that are used for bit line contact to the source and drain regions of the semiconductor substrate. A storage node contact hole, is opened in a third insulator layer, and in the second insulator layer, exposing the top surface of a polysilicon contact pad, that is used for capacitor contact to a source and drain region of the semiconductor substrate. A polysilicon storage node structure, with an overlying capacitor dielectric layer, is next formed in the storage node contact hole, followed by the opening of a first contact hole, in the third insulator layer, in the second insulator layer, and in the first insulator layer, exposing a source and drain region of the semiconductor substrate. A second contact hole is opened in the third insulator layer, in the second insulator layer, in the first insulator layer, and in the silicon nitride layer, overlying a polycide gate structure, exposing the top surface of the polycide gate structure. A titanium nitride layer, and a tungsten layer, are deposited on the storage node structure, while also completely filling the first contact hole, and the second contact hole. Patterning of the tungsten layer, and of the titanium nitride layer, is performed, simultaneously creating the capacitor plate, on the underlaying the storage node structure, and the substrate contact structure, in the first contact hole, and a word line contact structure, in the second contact hole.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a high density DRAM cell, featuring simultaneous formation a capacitor plate, of an STC structure, and metal contact structures, will now be described in detail. The transfer gate transistor, used for this DRAM device, in this invention, will be an N channel device. However the process for simultaneous formation of a capacitor plate electrode, and metal contact structures, can also be applied to DRAM devices, comprised of P channel, transfer gate transistor.

Figure 1:
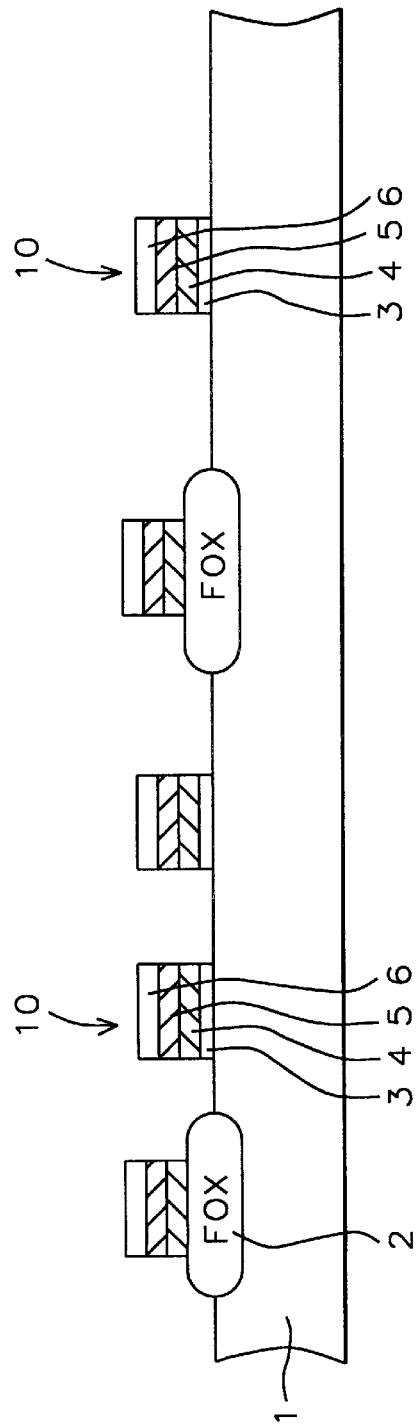
FIGS. 1–12, which schematically, in cross-sectional style, show the key fabrication stages used to create a high density DRAM device, using the same process sequence to form the plate capacitor electrode, of a STC structure, and metal contact structures, used in the high density DRAM cell.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX regions 2, from growing on areas of semiconductor substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon dioxide is thermally grown in an oxygen-steam ambient, at a temperature between about 850 to 1050° C., to a thickness between about 50 to 200 Angstroms. A polysilicon layer 4, is next deposited using low pressure chemical vapor deposition, (LPCVD), procedures, at a temperature between about 500 to 700° C., to a thickness between about 500 to 2000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first tungsten silicide layer 5, is next deposited using LPCVD procedures, to a thickness between about 500 to 2000 Angstroms, followed by the deposition of a capping, first silicon nitride layer 6, obtained via LPCVD or plasma enhanced chemical vapor deposition, (PECVD), procedures, to a thickness between about 600 to 1500 Angstroms. Conventional photolithographic and reactive ion etching, (RIE), procedures, using $CF_4$ as an etchant for first silicon nitride layer 6, and using $Cl_2$ as an etchant for tungsten silicide layer 5, and for polysilicon layer 4, are used to create polycide structures 10, (tungsten silicide - polysilicon), with overlying capping, first silicon nitride layer 6, shown schematically in FIG. 1. Photoresist removal is accomplished via plasma oxygen ashing and careful wet cleans.

Figure 2:
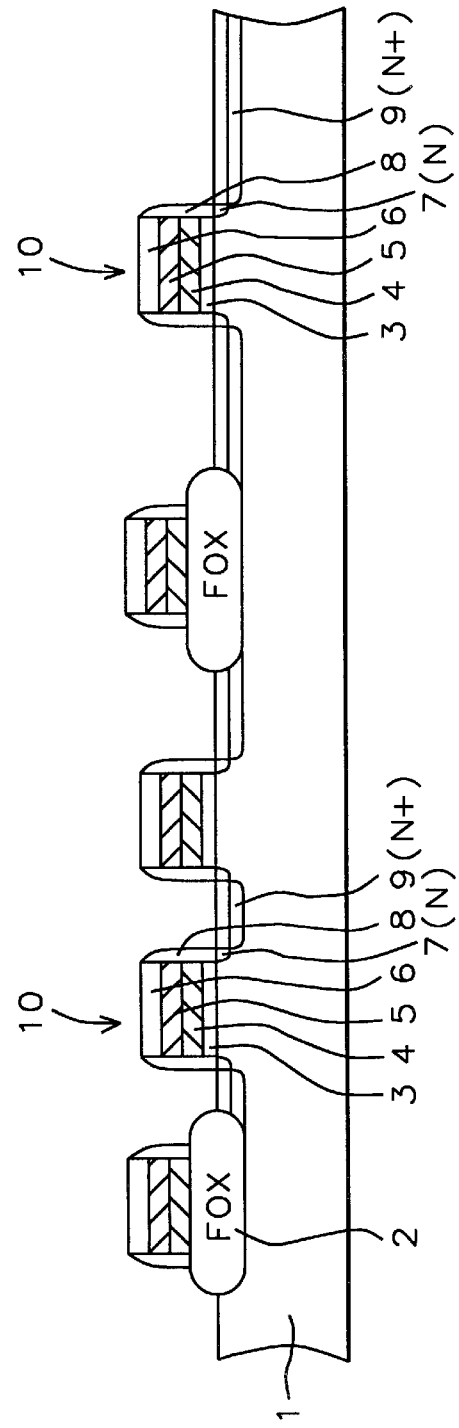

A lightly doped source and drain region 7, is next formed via ion implantation of phosphorous, at an energy between about 20 to 50 KeV, at a dose between about 1E13 to 1E14 atoms/cm$^2$. A second silicon nitride layer is then deposited using either LPCVD or PECVD procedures, at a temperature between about 400 to 700° C., to a thickness between about 1500 to 4000 Angstroms, followed by an anisotropic RIE procedure, using $CF_4$ as an etchant, creating silicon nitride spacers, 8, on the sides of polycide gate structures 10, completely encapsulating polycide gate structures 10, with capping, first silicon nitride layer 6, and silicon nitride spacers 8. A heavily doped source and drain region, 8, is then formed via ion implantation of arsenic, at an energy between about 30 to 100 KeV, at a dose between about 1E14 to 5E16 atoms/cm$^2$. This is schematically shown in FIG. 2.

Figure 3:
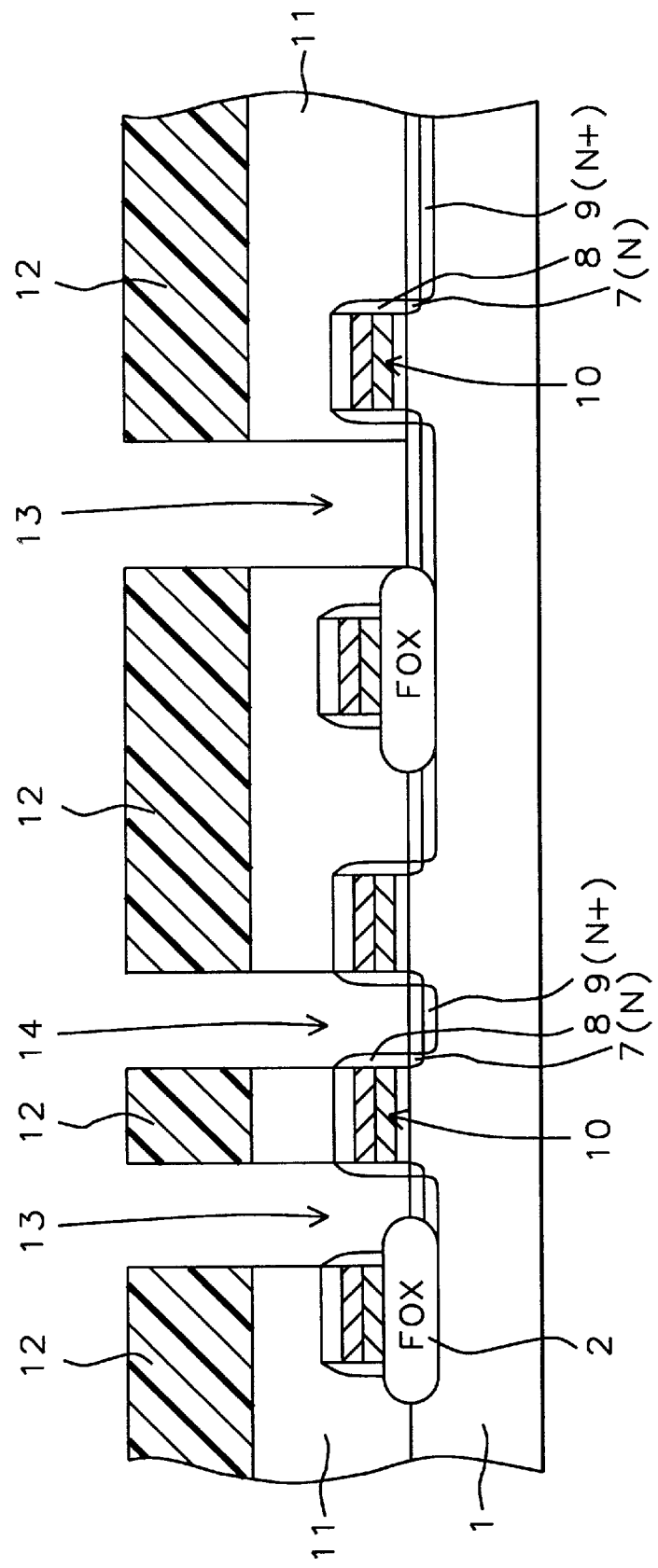

A first insulator layer 11, of silicon oxide, is next deposited using LPCVD or PECVD procedures, at a temperature between about 400 to 800° C., to a thickness between about 3000 to 8000 Angstroms, followed by a planarization procedure, using a chemical mechanical polishing, (CMP), procedure, used to create a smooth top surface for insulator layer 11. Conventional photolithographic procedures, using photoresist shape 12, as a mask, and an anisotropic RIE procedure, using $CHF_3$ as an etchant for insulator layer 11, are used to open self-aligned contact, (SAC), holes 13, as well as SAC hole 14, in insulator layer 11, exposing the top surface of heavily doped source and drain regions 9, between the silicon nitride encapsulated, polycide gate structures 10. This is schematically shown in FIG. 3. SAC holes 13, will be used to allow contact between subsequent bit lines, and source and drain regions, while SAC hole 14, will be used to allow contact between a STC structure, and a source and drain region.

Figure 4:
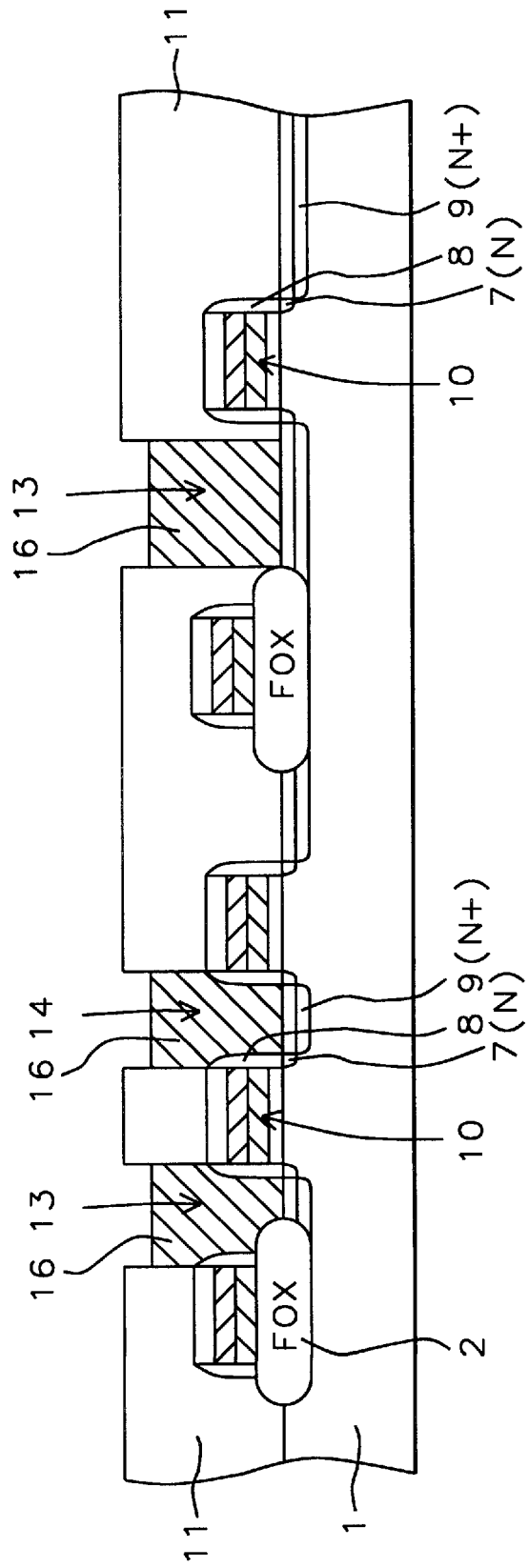

Removal of photoresist shape is accomplished via use of plasma oxygen ashing and careful wet cleans. Conductive polysilicon contact plugs 16, schematically shown in FIG. 4, are next formed. Polysilicon contact plugs 14, are formed via deposition of a polysilicon layer, via LPCVD procedures, at a thickness between about 1000 to 3000 Angstroms, doped during an in situ doping, deposition procedure, or grown intrinsically and doped via an arsenic, or a phosphorous, ion implantation procedure, followed by a patterning procedure, via anisotropic RIE procedures, using $Cl_2$ as an etchant, or via a CMP procedure. The anisotropic RIE procedure, used to remove unwanted regions of polysilicon from the top surface of insulator layer 11, is extended to recess polysilicon contact plugs 16, below the top surface of insulator layer 11. This is schematically shown in FIG. 4.

Figure 5:
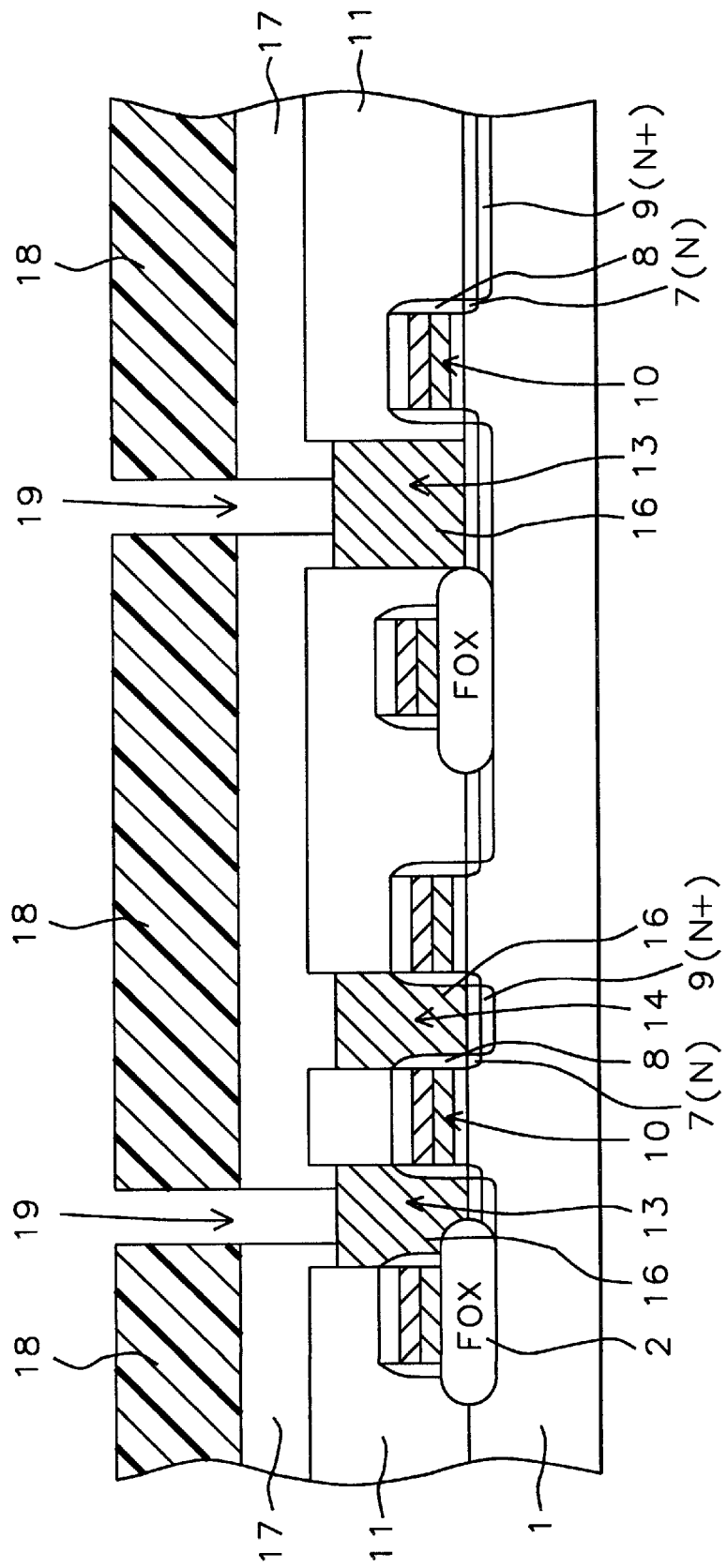
Figure 6:
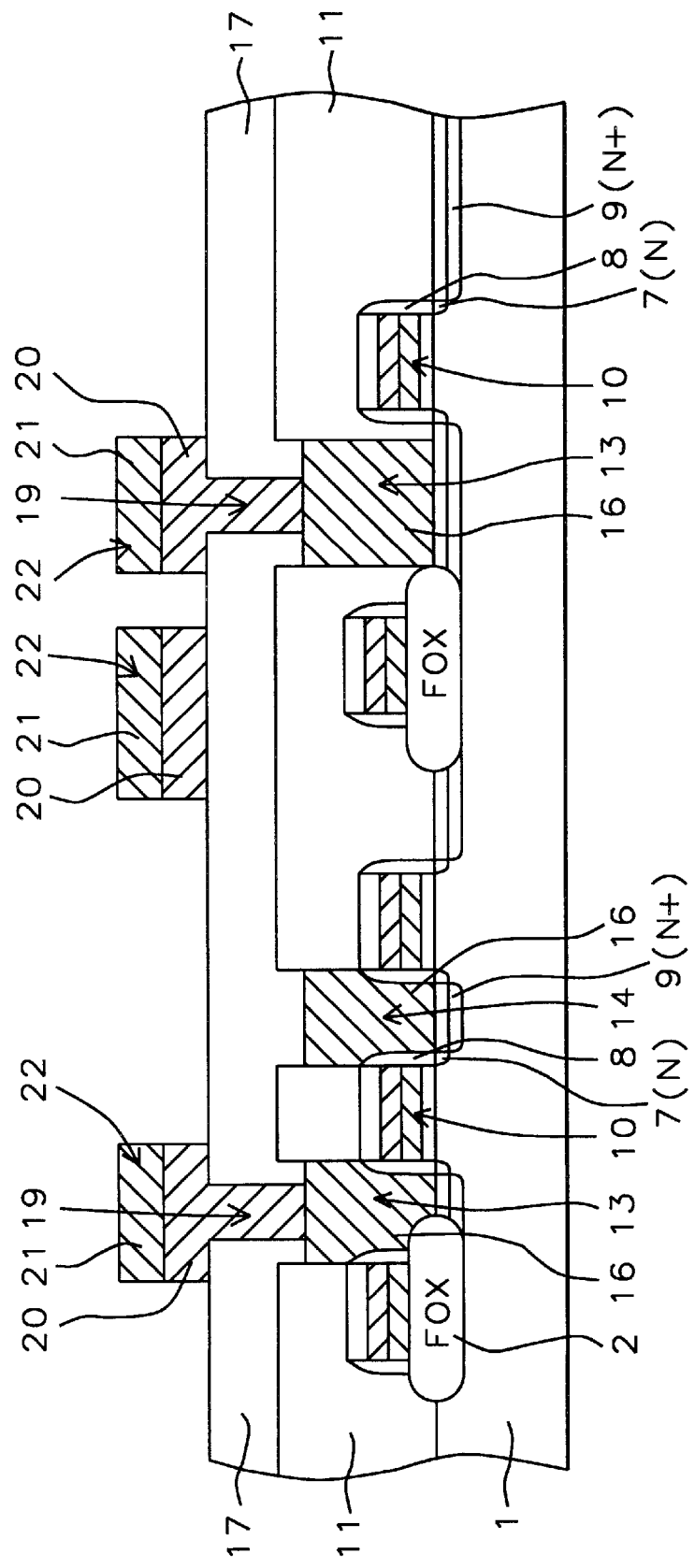

A second insulator layer 17, of silicon oxide, is next deposited using either LPCVD or PECVD procedures, at a temperature between about 650 to 750° C., to a thickness between about 2000 to 4000 Angstroms. Insulator layer 17, can also be a BPSG or PSG layer, obtained via addition of either $PH_3$ and $B_2H_6$, or just $PH_3$, to a TEOS, (tetraethylorthosilicate), ambient. Photolithographic and RIE procedure, using photoresist shape 18, as a mask, and using $CHF_3$ as an etchant for second insulator layer 17, are used to create via holes 19, exposing the top surface of polysilicon contact plugs 16, in SAC holes 13, to be used for subsequent bit line contact. This is schematically shown in FIG. 5. After removal of photoresist shape 18, again using plasma oxygen ashing and careful wet cleans, polycide bit line structures 22, are formed. First a polysilicon layer 20, is deposited via LPCVD procedures, to a thickness between about 500 to 2000 Angstroms. Polysilicon layer 20, is again doped either during an in situ deposition procedure, via the addition of arsine, or phosphine, to a silane ambient, or via an arsenic, or phosphorous, ion implantation procedure, applied to an intrinsically grown polysilicon layer 20. Next another tungsten silicide layer 21, is deposited using LPCVD procedures, to a thickness between about 500 to 2000 Angstroms. Photolithographic and anisotropic RIE procedures, using $Cl_2$ as an etchant, are used to create polycide, (tungsten silicide - polysilicon), bit line structures 22, shown schematically in FIG. 6. Polycide bit line structures 22, contact underlying source and drain regions, via direct contact to polysilicon contact plugs 16, located in SAC holes 13. Removal of the photoresist shape, used as a mask for patterning of polycide bit line structures 22, is again performed using plasma oxygen ashing, and careful wet cleans.

Figure 7:
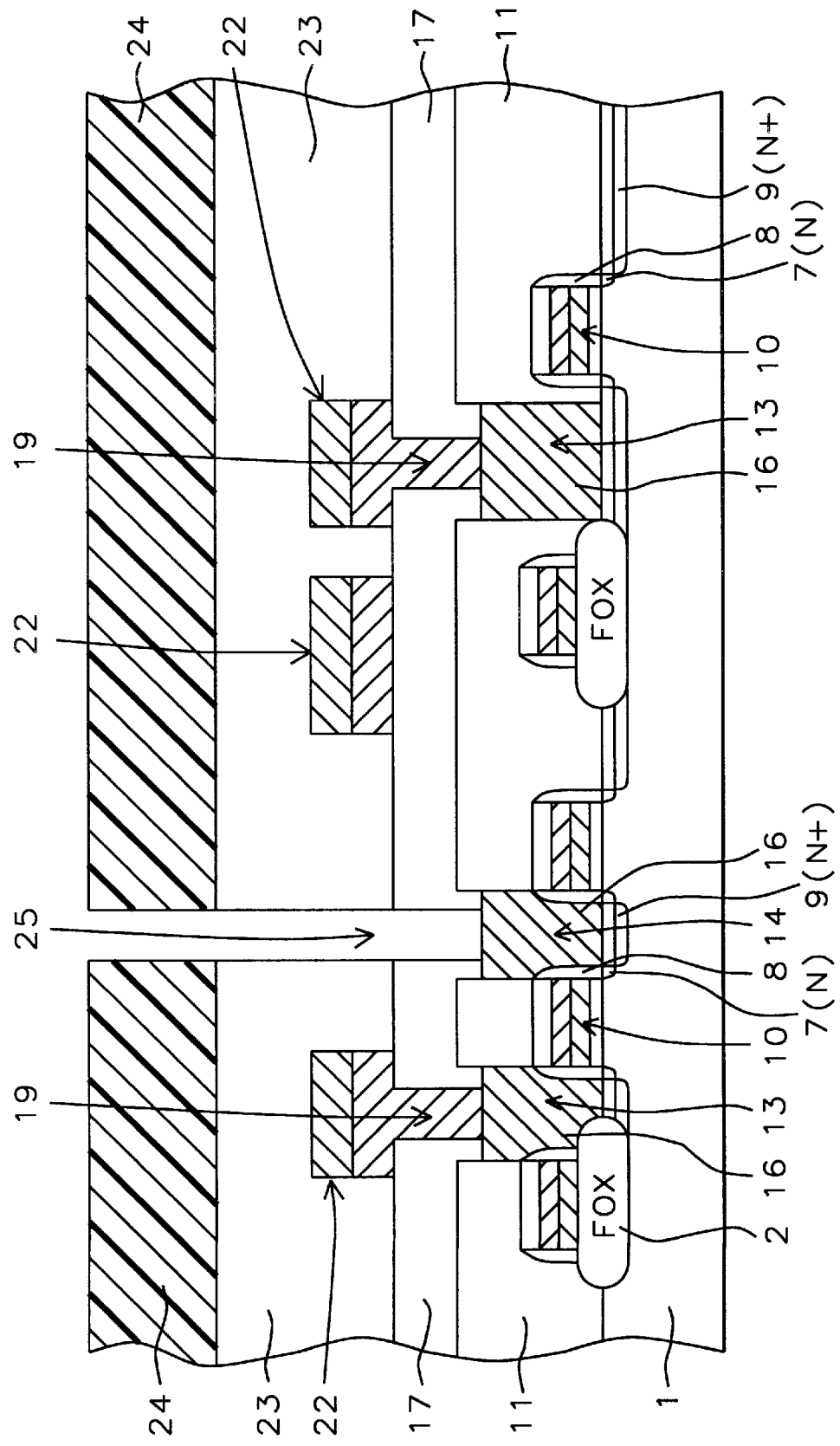
Figure 8:
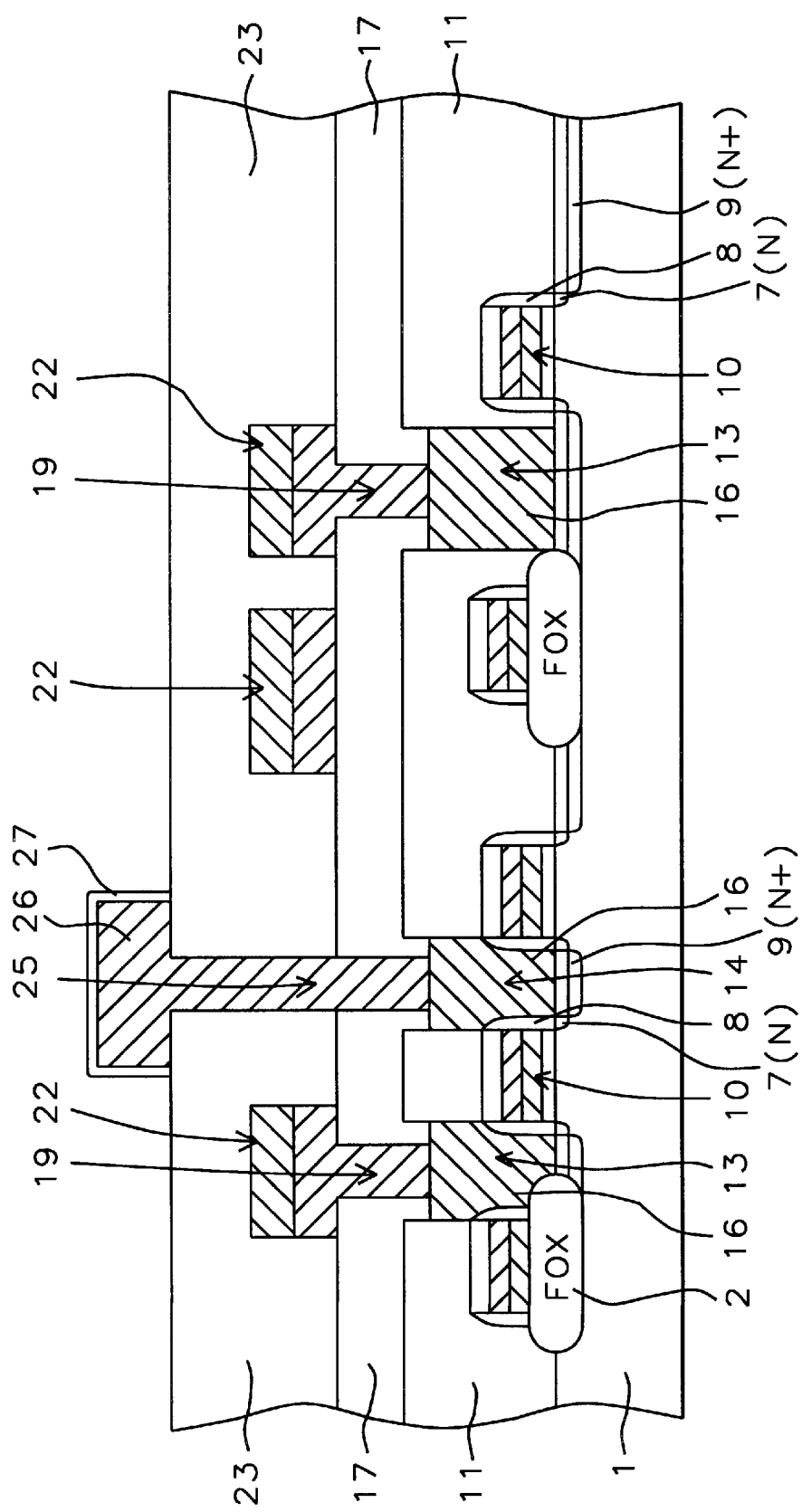

A third insulator layer 23, of silicon oxide is deposited using a PECVD or LPCVD procedure, at a temperature between about 400 to 800° C., to a thickness between about 2000 to 5000 Angstroms, followed by a CMP procedure, used to planarize the top surface of third insulator layer 23. Photoresist shape 24, is next formed, and used as a mask to allow storage node contact hole 25, to be formed in third insulator layer 23, and in second insulator layer 17, via an anisotropic RIE procedure, using $CHF_3$ as an etchant, exposing the top surface of polysilicon contact plug 16, in SAC hole 14, to be used for contact between a subsequent STC structure, and a source and drain region. This is schematically shown in FIG. 7. After removal of photoresist shape 24, via plasma oxygen ashing and careful wet cleans, a polysilicon storage node electrode 26, and a capacitor dielectric layer 27, are formed. Polysilicon storage node electrode 26, is formed via a deposition of a polysilicon layer, using an LPCVD procedure, to a thickness between about 4000 to 12000 Angstroms, completely filling storage node contact hole 25. The polysilicon layer is doped during deposition, via addition of arsine, or phosphine, to a silane ambient. Photolithographic and RIE procedures, using $Cl_2$ as an etchant, are used to form polysilicon storage node electrode 26. After removal of the photoresist shape used to define polysilicon storage node 26, via plasma oxygen ashing and careful wet cleans, a high dielectric constant layer 27, such as $Ta_2O_5$, formed on polysilicon storage node 26, via R.F. sputtering, is deposited at a thickness between about 50 to 200 Angstroms. Capacitor dielectric layer 27, may also be a barium strontium titanate, (BST), layer, deposited using chemical vapor deposition, (CVD), or plasma vapor deposition, (PVD), procedures, to a thickness between about 50 to 200 Angstroms. Regions of unwanted capacitor dielectric layer 27, are removed from the top surface of third insulator layer 23, via RIE procedures, using $Cl_2$ or HBr as an etchant, resulting in a polysilicon storage node electrode 26, overlaid with capacitor dielectric layer 27, schematically shown in FIG. 8. (Capacitor dielectric layer 27, overlying polysilicon storage node 26, was protected with photoresist during the removal of the capacitor dielectric layer, from the surface of third insulator layer 23).

Figure 9:
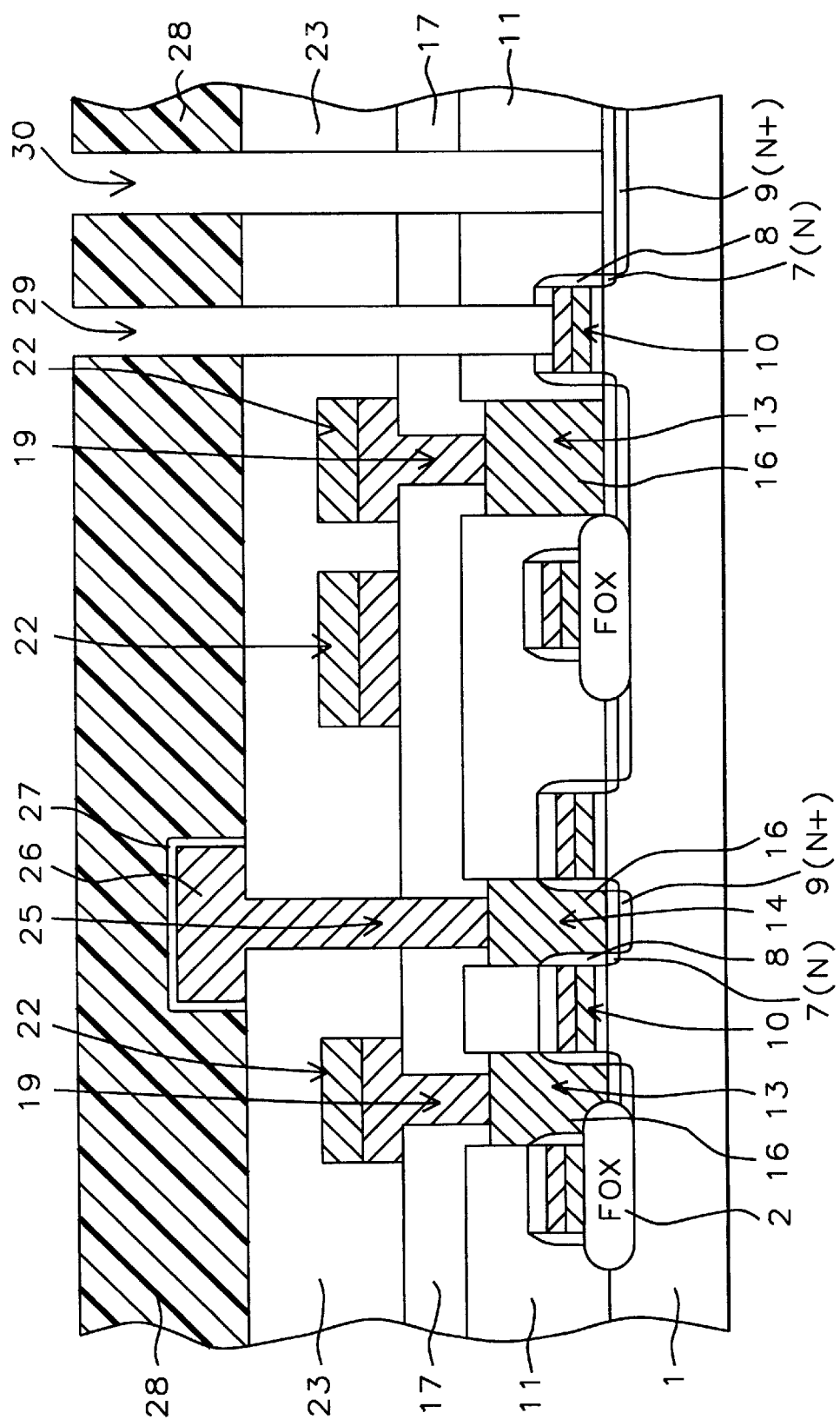

Photoresist shape 28, is next used as a mask to allow the opening of the word line contact hole 29, to be achieved via anisotropic RIE of third insulator layer 23, second insulator layer 17, first insulator layer 11, and capping silicon nitride layer 6, exposing the top surface of polycide gate structure 10. The same etching procedure is used to open metal contact hole 30, in third insulator layer 23, second insulator layer 17, and first insulator 11, exposing the top surface of a region of semiconductor substrate 1. The anisotropic RIE procedure was accomplished using $CHF_3$ as an etchant. This is schematically shown in FIG. 9.

Figure 10:
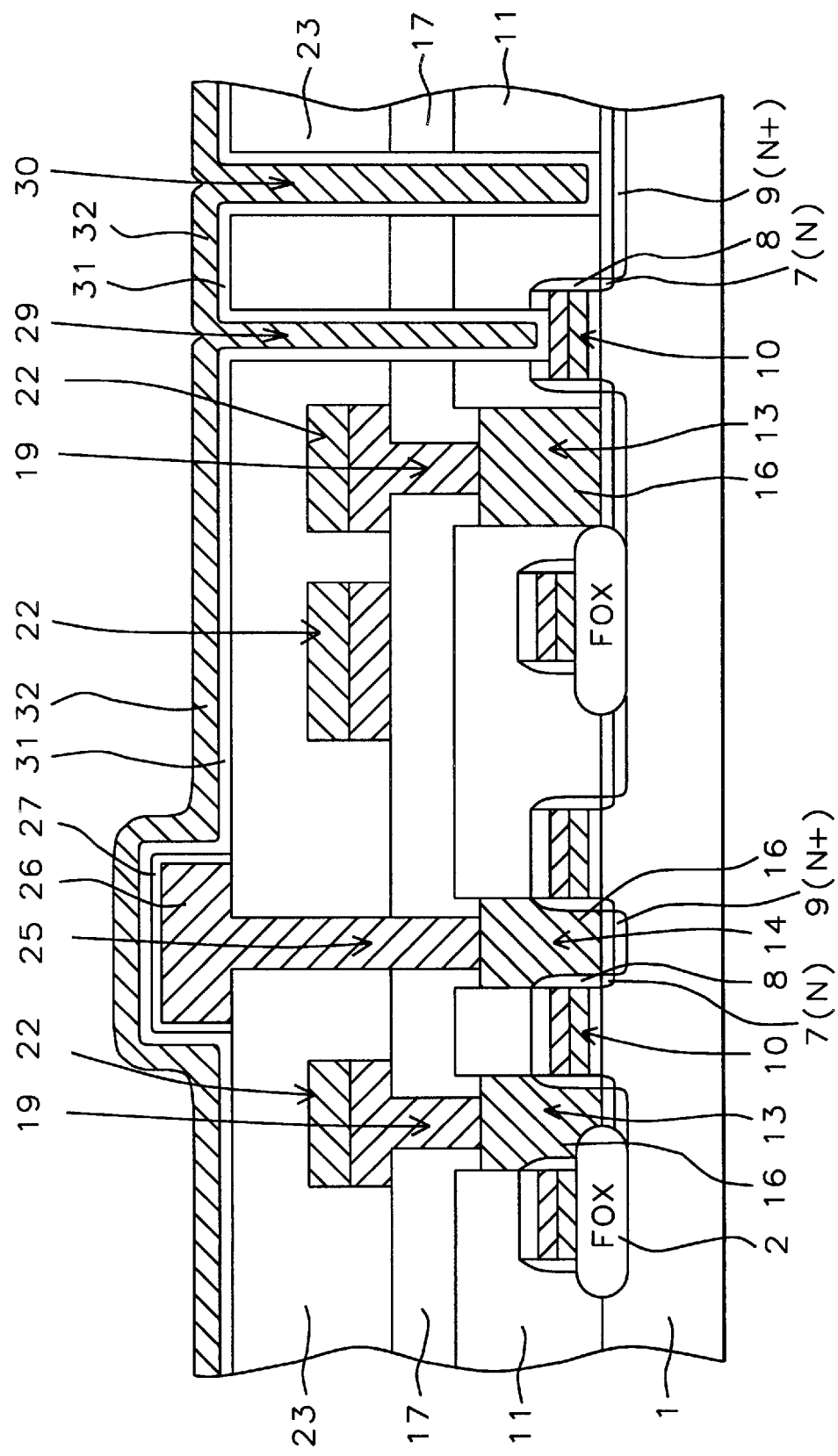
Figure 11:
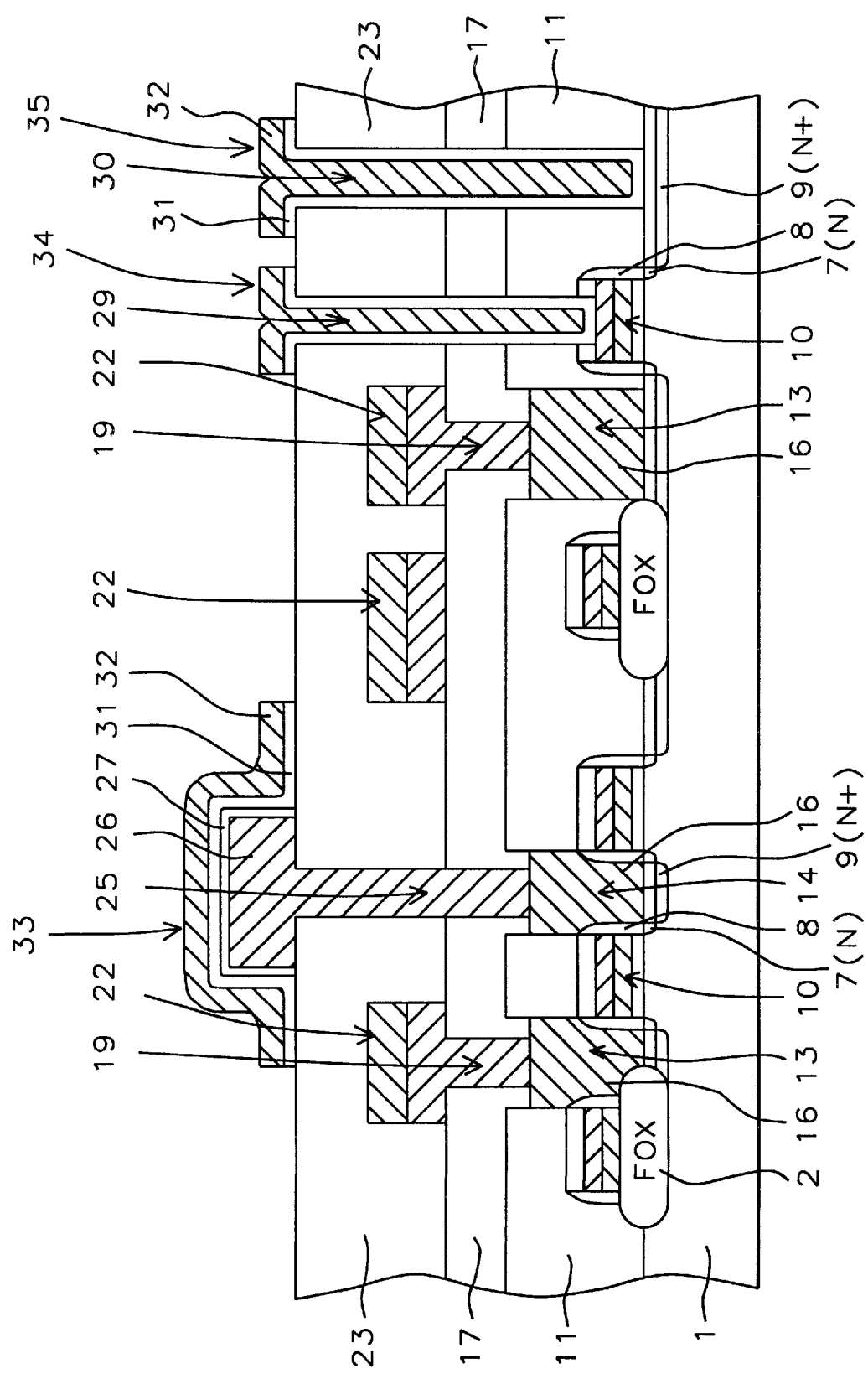

After removal of photoresist shape 28, via plasma oxygen ashing and careful wet cleans, the SPM, (Simultaneous formed capacitor Plate and Metal contact structures), sequence is addressed. First a barrier layer 31, is deposited to a thickness between about 100 to 1000 Angstroms. Barrier layer 31, can be a titanium nitride, or a tungsten nitride layer, deposited using R.F. sputtering procedures. Next a tungsten layer 32, is deposited using LPCVD or R.F. sputtering procedures, to a thickness between about 1000 to 5000 Angstroms, completely filling word line contact hole 29, and metal contact hole 30. This is schematically shown in FIG. 10. A photolithographic and RIE procedure, using $Cl_2$ as an etchant for tungsten layer 32, and for barrier layer 31, is next used to create a capacitor plate structure, for STC structure 33, comprised of tungsten layer 32, and barrier layer 31, overlying the capacitor dielectric coated, storage node electrode structure. The identical photolithographic and RIE procedure simultaneously forms word line contact structure 34, and metal contact structure 35. The ability to completely fill word line contact hole 29, and metal contact hole 30, with metal, allowed the simultaneous patterning of the capacitor plate, the word line contact structure, and the metal contact structure, to be realized via RIE removal of unmasked regions of tungsten layer 32, and barrier layer 31, from the top surface of third insulator layer 23. The result of these procedures are schematically shown in FIG. 11, after removal of the masking photoresist layer, again using plasma oxygen ashing and careful wet cleans.

Figure 12:
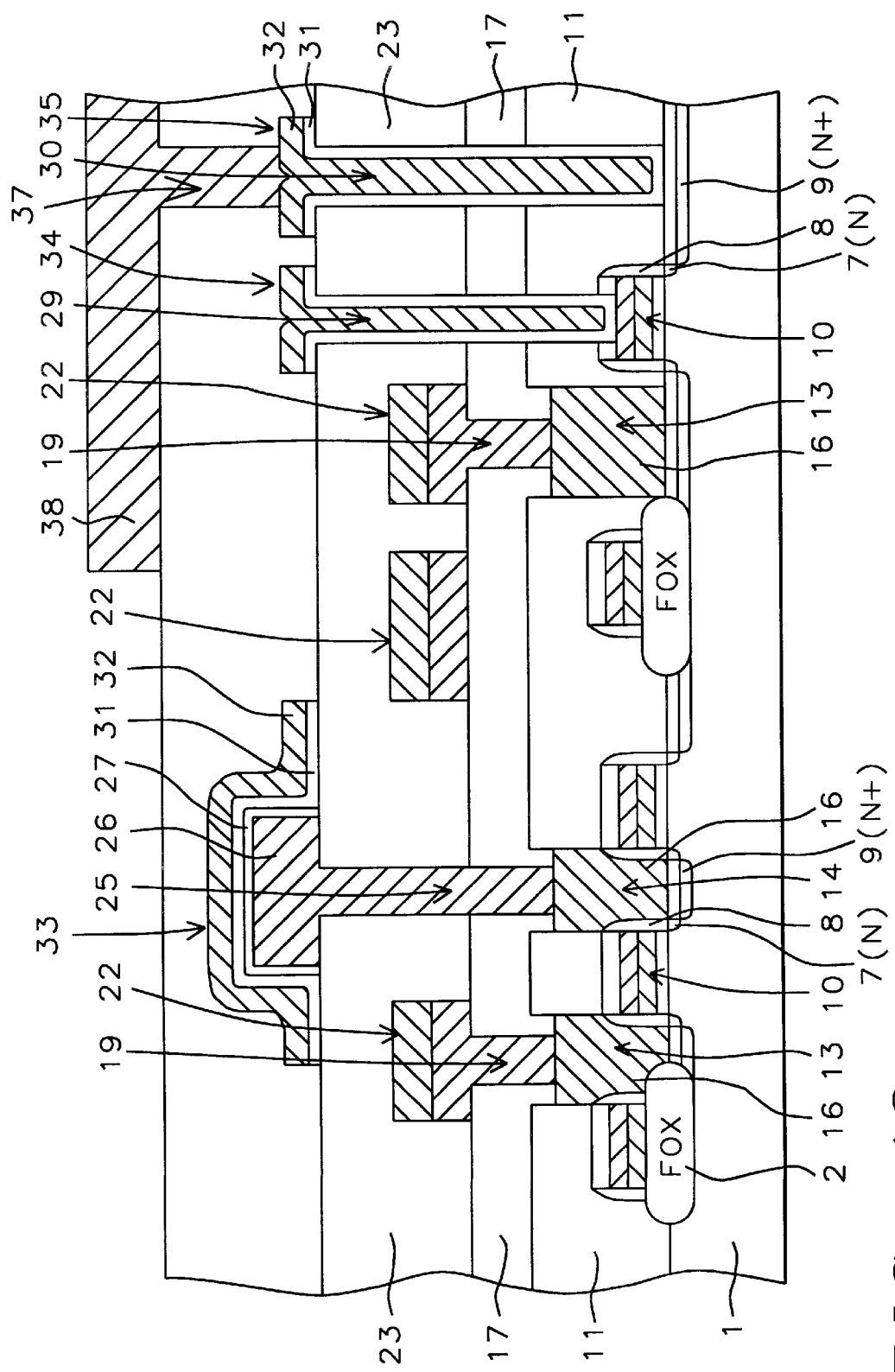

FIG. 12, schematically shows the creation of a metal interconnect structure 38, contacting metal contact structure 35. A fourth insulator layer 36, is deposited using PECVD or LPCVD procedures, to a thickness between about 2000 to 10000 Angstroms, and planarized using a CMP procedure. A photolithographic and RIE procedure, using $CHF_3$ as an etchant, is used to open via hole 37, exposing the top surface of metal contact structure 35. After removal of the photoresist shape, used to create via hole 37, using plasma oxygen ashing and careful wet cleans, a layer of aluminum, containing between about 0 to 2% copper, is deposited, to a thickness between about 2000 to 5000 Angstroms, using R.F. sputtering. Photolithographic and RIE procedures, using $Cl_2$ as an etchant, are used to form metal interconnect structure 38, schematically shown in FIG. 12. Photoresist removal is once again accomplished using plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of simultaneously fabricating a capacitor plate, for a stacked capacitor structure, a word line contact structure, and a metal contact structure, for a DRAM device, comprising the steps of:

providing transfer gate transistors, on a semiconductor substrate, comprised of polycide gate structures, on a gate insulator layer, with source and drain regions in said semiconductor substrate, in an area not covered by said polycide gate structures;

providing a polysilicon contact plug, in contact hole in a first insulator layer, with the polysilicon contact plug placed between said polysilicon gate structures of said transfer gate transistor, and with said polysilicon contact plug, contacting a source and drain region, of said transfer gate transistor;

opening a storage node contact hole, in a first composite insulator layer, exposing the top surface of said polysilicon contact plug;

forming a storage node electrode, in said storage node contact hole, contacting said polysilicon contact plug;

forming a capacitor dielectric layer on said storage node electrode;

opening a metal contact hole in a second composite insulator layer, exposing a region of said semiconductor substrate;

opening a word line contact hole in a third composite insulator layer, exposing the top surface of a polycide gate structure;

depositing a barrier layer on said capacitor dielectric layer, overlying said storage node electrode, and coating the sides of, and the bottom of, said metal contact hole, and the sides of, and the bottom of, said word line contact hole;

depositing a tungsten layer on said barrier layer, completely filling said metal contact hole and said word line contact hole; and patterning of said tungsten layer, and of said barrier layer, to create said capacitor plate, on said capacitor dielectric layer of said storage node electrode, and to create said word line contact structure, in said word line contact hole, and said metal contact structure, in said metal contact hole.

2. The method of claim 1, wherein said polysilicon contact plug is formed via deposition of a polysilicon layer, using an LPCVD procedure, to a thickness between about 1000 to 3000 Angstroms, with the polysilicon layer doped during an in situ deposition procedure, or doped via an arsenic or phosphorous ion implantation procedure, and with the polysilicon layer patterned by removal of unwanted regions from the top surface of said first insulator layer, via an anisotropic RIE procedure, using $Cl_2$ as an etchant, or by removal of unwanted regions of the polysilicon layer, using a CMP procedure.

3. The method of claim 1, wherein said storage node contact hole is opened in said first composite insulator layer, using an anisotropic RIE procedure, using $CHF_3$ as an etchant, with said first composite insulator layer comprised of: a third insulator of silicon oxide, obtained via either LPCVD or PECVD procedures, at a thickness between about 2000 to 5000 Angstroms; and of a second insulator layer of silicon oxide, deposited using LPCVD or PECVD procedures, to a thickness between about 2000 to 4000 Angstroms.

4. The method of claim 3, wherein said metal contact hole is opened in said second composite insulator layer, via an anisotropic RIE procedure, using $CHF_3$ as an etchant, with said second composite insulator layer comprised of: said third insulator layer; said second insulator layer; and said first insulator layer, a silicon oxide layer, obtained using LPCVD or PECVD procedures, at a thickness between about 3000 to 8000 Angstroms.

5. The method of claim 3, wherein said word line contact hole is opened in said third composite insulator layer, via an anisotropic RIE procedure, using $CHF_3$ as an etchant, with said third composite insulator comprised of: said third insulator layer; said second insulator layer; a top portion of said first insulator layer, between about 2000 to 8000 Angstroms in thickness; and said silicon nitride layer, which overlays said polycide gate structure, at a thickness between about 1000 to 3000 Angstroms.

6. The method of claim 1, wherein said storage node electrode is formed from an N type polysilicon layer, deposited using an LPCVD procedure, to a thickness between about 4000 to 12000 Angstroms, doped during an in situ deposition procedure, and patterned via an anisotropic RIE procedure, using $Cl_2$ as an etchant.

7. The method of claim 1, wherein said capacitor dielectric layer is $Ta_2O_5$, deposited using R.F. sputtering, to a thickness between about 50 to 200 Angstroms.

8. The method of claim 1, wherein said capacitor dielectric layer is barium strontium titanate, deposited using CVD or PVD procedures, to a thickness between about 50 to 200 Angstroms.

9. The method of claim 1, wherein said barrier layer is titanium nitride, deposited using R.F. sputtering, to a thickness between about 100 to 1000 Angstroms.

10. The method of claim 1, wherein said barrier layer is tungsten nitride, deposited using R.F sputtering procedures, to a thickness between about 100 to 1000 Angstroms.

11. The method of claim 1, wherein said tungsten layer is deposited using LPCVD or R.F. sputtering procedures, to a thickness between about 1000 to 5000 Angstroms.

12. The method of claim 1, wherein patterning of said tungsten layer, and of said barrier layer, used to simultaneously form said capacitor plate, said metal contact hole structure, and said word line structure, is achieved via an anisotropic RIE procedure, using $Cl_2$ as an etchant.

13. A method of fabricating a DRAM device, on a semiconductor substrate, in which a capacitor plate of a stacked capacitor structure, a word line contact structure, and a metal contact structure, are formed using a single deposition procedure, and a single patterning procedure, comprising the steps of:

providing transfer gate transistors, on said semiconductor substrate, comprised of silicon nitride encapsulated, polycide gate structures, on a silicon dioxide gate insulator layer, and with source and drain regions, in said semiconductor substrate, between said silicon nitride encapsulated, polycide gate structures;

depositing a first insulator layer;

planarizing said first insulator layer;

forming self-aligned contact holes, in said first insulator layer, to a first source and drain region, and to a second source and drain region;

depositing a first polysilicon layer, completely filling said self-aligned contact holes;

removing said first polysilicon layer from the top surface of said first insulator layer, resulting in the formation of polysilicon contact plugs, in said self-aligned contact holes;

recessing of said polysilicon contact plugs, in said self-aligned contact holes, to a level below the top surface of said first insulator layer;

depositing a second insulator layer;

opening bit line contact holes to a first polysilicon contact plug, overlying a first source and drain region;

depositing a second polysilicon layer;

depositing a tungsten silicide layer;

patterning of said tungsten silicide layer, and of said second polysilicon layer, to create a bit line contact structure, in said bit line contact hole, overlying said first polysilicon contact plug;

depositing a third insulator layer;

planarizing said third insulator layer;

opening a storage node contact hole in said third insulator layer, and in said second insulator layer, exposing the top surface of a second polysilicon contact plug, overlying said second source and drain region;

depositing a third polysilicon layer;

patterning of said third polysilicon layer to create a storage node electrode, in said storage node contact hole;

forming a capacitor dielectric layer on said storage node contact hole;

opening a metal contact hole in said third insulator layer, in said second insulator layer, and in said first insulator layer, exposing a region of said semiconductor substrate;

opening a word line contact hole in said third insulator layer, in said second insulator layer, in said first insulator layer, and in said silicon nitride encapsulated layer, exposing the top surface of said polycide gate structure;

depositing a barrier layer on said capacitor dielectric layer, on said storage node electrode, and on exposed surfaces of said metal contact hole, and on exposed surfaces of said word line contact hole;

depositing a tungsten layer on said barrier layer, completely filling said metal contact hole, and completely filling said word line contact hole; and patterning of said tungsten layer, and of said barrier layer, to simultaneously form capacitor plate, for said stacked capacitor structure, said metal contact structure in said metal contact hole, and said word line contact structure, in said word line contact hole.

14. The method of claim 13, wherein said first insulator layer is silicon oxide, obtained via LPCVD or PECVD procedures, to a thickness between about 3000 to 8000 Angstroms, and planarized using a CMP procedure.

15. The method of claim 13, wherein said first polysilicon layer, used for said polysilicon contact plugs, is deposited using LPCVD procedures, to a thickness between about 1000 to 3000 Angstroms, and doped in situ during deposition via the addition of either arsine or phosphine, to a silane ambient, or said first polysilicon layer can be deposited intrinsically and doped via an arsenic or phosphorous ion implantation procedure.

16. The method of claim 13, wherein said second insulator layer is silicon oxide, deposited using LPCVD or PECVD procedures, to a thickness between about 2000 to 4000 Angstroms.

17. The method of claim 13, wherein said second polysilicon layer, used for said bit line contact structure, is obtained via an LPCVD procedure, to a thickness between about 500 to 2000 Angstroms, and doped N type during an in situ deposition procedure, via the addition of arsine or phosphine to a silane ambient, or said second polysilicon layer is grown intrinsically and doped via an arsenic or phosphorous ion implantation procedure.

18. The method of claim 13, wherein said tungsten silicide layer, used for said bit line contact structure, is deposited using LPCVD procedures, to a thickness between about 500 to 2000 Angstroms.

19. The method of claim 13, wherein said third insulator layer is silicon oxide, deposited using PECVD or LPCVD procedures, to a thickness between about 2000 to 5000 Angstroms, and planarized using a CMP procedure.

20. The method of claim 13, wherein said third polysilicon layer, used for said storage node electrode, is deposited using an LPCVD procedure, to a thickness between about 4000 to 12000 Angstroms, and doped N type, during an in situ deposition procedure via the addition of arsine or phosphine, to a silane ambient.

21. The method of claim 13, wherein said capacitor dielectric layer is $Ta_2O_5$, obtained using R.F. sputtering, to a thickness between about 50 to 200 Angstroms.

22. The method of claim 13, wherein said capacitor dielectric layer is barium strontium titanate, obtained using CVD or PVD procedures, to a thickness between about 50 to 200 Angstroms.

23. The method of claim 13, wherein said barrier layer is a titanium nitride layer is deposited using R.F. sputtering, to a thickness between about 100 to 1000 Angstroms.

24. The method of claim 13, wherein said barrier layer is a tungsten nitride layer, deposited using R.F. sputtering procedures, to a thickness between about 100 to 1000 Angstroms.

25. The method of claim 13, wherein said tungsten layer is deposited using an LPCVD procedure, or R.F. sputtering, to a thickness between about 1000 to 5000 Angstroms.

26. The method of claim 13, wherein patterning of said tungsten layer, and of said barrier layer, used to form said capacitor plate, for said stacked capacitor structure, and used to form said metal contact structure, and said word line structure, is performed via an anisotropic RIE procedure, using $Cl_2$ as an etchant.

* * * * *